(12) United States Patent
Hai et al.

(10) Patent No.: US 12,532,647 B2
(45) Date of Patent: Jan. 20, 2026

(54) DISPLAY SUBSTRATE AND DISPLAY APPARATUS WITH PHOTOELECTRIC CONVERSION LAYER

(71) Applicant: BOE Technology Group Co., Ltd., Beijing (CN)

(72) Inventors: Xiaoquan Hai, Beijing (CN); Yingzi Wang, Beijing (CN); Xue Dong, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 421 days.

(21) Appl. No.: 18/022,489

(22) PCT Filed: Apr. 11, 2022

(86) PCT No.: PCT/CN2022/086176
§ 371 (c)(1),
(2) Date: Feb. 21, 2023

(87) PCT Pub. No.: WO2023/197118
PCT Pub. Date: Oct. 19, 2023

(65) Prior Publication Data
US 2024/0268202 A1      Aug. 8, 2024

(51) Int. Cl.
*H10K 59/80* (2023.01)
(52) U.S. Cl.
CPC ............................... *H10K 59/8792* (2023.02)

(58) Field of Classification Search
None
See application file for complete search history.

(56) References Cited

U.S. PATENT DOCUMENTS

| | | | |
|---|---|---|---|
| 2019/0065813 A1* | 2/2019 | Xu | G02B 6/10 |
| 2020/0125212 A1* | 4/2020 | Hai | G06V 40/1318 |
| 2021/0110131 A1* | 4/2021 | Lin | H10F 39/8057 |
| 2021/0397806 A1 | 12/2021 | Lu et al. | |
| 2022/0271103 A1 | 8/2022 | Hai et al. | |

(Continued)

FOREIGN PATENT DOCUMENTS

| | | |
|---|---|---|
| CN | 109376648 A | 2/2019 |
| CN | 110399797 A | 11/2019 |

(Continued)

*Primary Examiner* — Nduka E Ojeh
(74) *Attorney, Agent, or Firm* — IPro, PLLC

(57) ABSTRACT

Provides are a display substrate and a display apparatus. The display substrate includes a base substrate, light-emitting devices and photosensitive devices on the base substrate in an array, orthographic projections of the photosensitive devices overlap orthographic projections of gaps of the light-emitting devices on the base substrate, each photosensitive device includes a photoelectric conversion layer, each photoelectric conversion layer includes at least one photoelectric conversion part; a black matrix on a side, away from the base substrate, of a layer where the light-emitting devices are; an orthographic projection of the black matrix overlaps the orthographic projections of the gaps of the light-emitting devices on the base substrate, the black matrix has openings, orthographic projections of the openings overlap the orthographic projections of the photoelectric conversion parts on the base substrate.

20 Claims, 17 Drawing Sheets

(56) References Cited

U.S. PATENT DOCUMENTS

| | | | |
|---|---|---|---|
| 2023/0109356 A1* | 4/2023 | Bae | H10K 59/126 |
| | | | 257/40 |
| 2023/0142687 A1 | 5/2023 | Ren et al. | |
| 2023/0157123 A1* | 5/2023 | Kubota | H05B 33/26 |
| | | | 257/40 |

FOREIGN PATENT DOCUMENTS

| | | |
|---|---|---|
| CN | 111095285 A | 5/2020 |
| CN | 111133446 A | 5/2020 |
| CN | 111312792 A | 6/2020 |
| CN | 112861651 A | 5/2021 |
| CN | 112861763 A | 5/2021 |
| KR | 101948870 B1 | 2/2019 |

* cited by examiner

DISPLAY SUBSTRATE AND DISPLAY APPARATUS WITH PHOTOELECTRIC CONVERSION LAYER

CROSS-REFERENCE TO RELATED APPLICATIONS

This application is a National Stage of International Application No. PCT/CN2022/086176, filed Apr. 11, 2022, which is hereby incorporated by reference in its entirety.

FIELD

The present disclosure relates to the technical field of display, in particular to a display substrate and a display apparatus.

BACKGROUND

With the rapid development of an information industry, a biological identification technology has been more and more widely applied, particularly, since different users have different fingerprints, it facilitates user identity verification, and therefore, the fingerprint identification technology has been widely applied to a plurality of fields such as mobile terminals and smart home to provide safety guarantee for user information.

SUMMARY

A display substrate and a display apparatus provided by the present disclosure have following specific solutions.

In a first aspect, an embodiment of the present disclosure provides a display substrate, including: a base substrate; a plurality of light-emitting devices, arranged on the base substrate in an array; a plurality of photosensitive devices, arranged on the base substrate in an array, wherein orthographic projections of the photosensitive devices on the base substrate overlap orthographic projections of gaps of the light-emitting devices on the base substrate, each photosensitive device includes a photoelectric conversion layer, and each photoelectric conversion layer includes at least one photoelectric conversion part; and a black matrix, located on a side, away from the base substrate, of a layer where the light-emitting devices are located, wherein an orthographic projection of the black matrix on the base substrate overlaps the orthographic projections of the gaps of the light-emitting devices on the base substrate, the black matrix has a plurality of openings, and orthographic projections of the openings on the base substrate overlap orthographic projections of the photoelectric conversion parts on the base substrate; and a collimating light-receiving angle θ in any direction determined by the openings and the photoelectric conversion parts meets a following relation:

$$0° \leq \theta \leq \arctan\left(\frac{P}{2H}\right);$$

wherein

P is a valley-ridge size of fingerprints, and H is a distance between a contact face of the fingerprints and the display substrate and an end face, away from one side of the base substrate, of the openings.

In the above display substrate provided by some embodiments of the present disclosure, the openings correspond to the photoelectric conversion parts one to one, the orthographic projections of the photoelectric conversion parts on the base substrate completely cover the orthographic projections of the corresponding openings on the base substrate, and orthographic projections of centers of the openings on the base substrate roughly coincide with orthographic projections of centers of the photoelectric conversion parts on the base substrate.

In the above display substrate provided by some embodiments of the present disclosure, in the same direction, a ratio of a size of the openings to a size of the photoelectric conversion parts is greater than or equal to 0.8 and less than or equal to 1.

In the above display substrate provided by some embodiments of the present disclosure, shapes of the orthographic projections of the openings on the base substrate and shapes of the orthographic projections of the photoelectric conversion parts on the base substrate are all rectangles; a collimating light-receiving angle $\theta_1$ in a long side direction, a collimating light-receiving angle $\theta_2$ in a broadside direction and a collimating light-receiving angle $\theta_3$ in a diagonal direction of the rectangle determined by the openings and the photoelectric conversion parts meet a following relation:

$$\theta_1 = \arctan\left(\frac{d_L + D_L}{2h}\right);$$

$$\theta_2 = \arctan\left(\frac{d_S + D_S}{2h}\right);$$

$$\theta_3 = \arctan\left(\frac{\sqrt{d_L^2 + d_S^2} + \sqrt{D_L^2 + D_S^2}}{2h}\right);$$

wherein
h is a distance between a surface, away from one side of the base substrate, of the photoelectric conversion parts and an end face, away from one side of the base substrate, of the openings, $d_L$ is a length of each photoelectric conversion part, $d_S$ is a width of each photoelectric conversion part, $D_L$ is a length of each opening, and $D_S$ is a width of each opening.

In the above display substrate provided by some embodiments of the present disclosure, $1 \leq d_L/d_S \leq 1.3$, and $1 \leq D_L/D_S \leq 1.3$.

In the above display substrate provided by some embodiments of the present disclosure, 200 μm≤P≤500 μm, 4 μm≤h≤22 μm, 7 μm≤$d_L$<14 μm, 7<$d_S$≤18.2 μm, 5.6 μm≤$D_L$≤14 μm and 5.6 μm≤$D_S$≤18.2 μm.

In the above display substrate provided by some embodiments of the present disclosure, in the same direction, a ratio of the size of the openings to the size of the photoelectric conversion parts is greater than 0 and less than 0.8.

In the above display substrate provided by some embodiments of the present disclosure, the shapes of the orthographic projections of the openings on the base substrate and the shapes of the orthographic projections of the photoelectric conversion parts on the base substrate are all polygons or circles.

In the above display substrate provided by some embodiments of the present disclosure, each photoelectric conversion layer includes the plurality of photoelectric conversion parts, and the orthographic projections of the photoelectric conversion parts on the base substrate are the same in shape and equal in area.

In the above display substrate provided by some embodiments of the present disclosure, in the same photosensitive device, the photoelectric conversion parts are rotationally symmetric with respect to the centers of the photosensitive devices.

In the above display substrate provided by some embodiments of the present disclosure, in the same photosensitive device, the photoelectric conversion layer includes the three photoelectric conversion parts, and central lines of the photoelectric conversion parts constitute an equilateral triangle.

In the above display substrate provided by some embodiments of the present disclosure, the four photosensitive devices in every two adjacent rows and columns are a repetitive unit, and the photoelectric conversion parts in the repetitive unit are rotationally symmetric with respect to a center of the repetitive unit.

In the above display substrate provided by some embodiments of the present disclosure, each photosensitive device includes a first electrode; and in the same photosensitive device, the orthographic projections of the photoelectric conversion parts on the base substrate are located in orthographic projections of the first electrodes on the base substrate.

In the above display substrate provided by some embodiments of the present disclosure further includes a filter layer located on a side, away from the base substrate, of each photosensitive device, orthographic projections of the filter layers on the base substrate overlap the orthographic projections of the photoelectric conversion parts on the base substrate, and the filter layers are configured to intercept ambient light above 600 nm.

In the above display substrate provided by some embodiments of the present disclosure, the filter layers fill the openings, and the orthographic projections of the filter layers on the base substrate roughly coincide with the orthographic projections of the openings on the base substrate.

In the above display substrate provided by some embodiments of the present disclosure further includes a blue light color resistor located on a side, away from the base substrate, of the black matrix, and the filter layers and the blue light color resistor are arranged at the same layer.

In the above display substrate provided by some embodiments of the present disclosure further includes a pixel defining layer located between a layer where a bottom electrode of each light-emitting device is located and a layer where a light-emitting function layer of each light-emitting device is located, and the pixel defining layer is reused as the filter layer.

In the above display substrate provided by some embodiments of the present disclosure further includes the pixel defining layer located between the layer where the bottom electrode of each light-emitting device is located and the layer where the light-emitting function layer of each light-emitting device is located; and each filter layer is located between the pixel defining layer and the light-emitting function layer of each light-emitting device, and the orthographic projections of the filter layers on the base substrate are located in an orthographic projection of the pixel defining layer on the base substrate.

In the above display substrate provided by some embodiments of the present disclosure further includes a flatting layer located between a layer where the photosensitive devices are located and a layer where the light-emitting devices are located, and the flatting layer is reused as the filter layer.

On the other hand, an embodiment of the present disclosure further provides a display apparatus, including the above display substrate provided by the embodiment of the present disclosure.

DETAILED DESCRIPTION OF THE EMBODIMENTS

Figure 1:
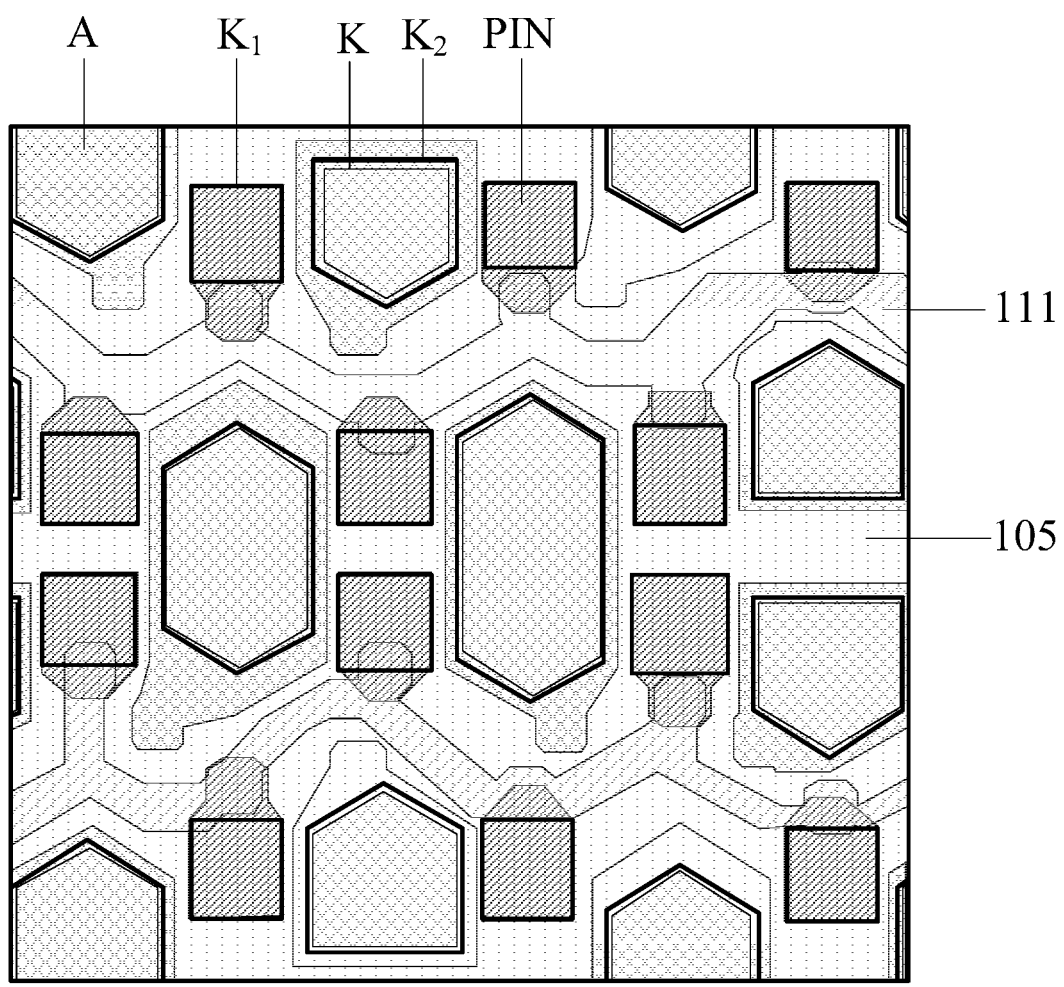
FIG. 1 is a schematic structural diagram of a display substrate provided by an embodiment of the present disclosure.

In order to make objectives, technical solutions and advantages of the embodiments of the present disclosure clearer, the technical solutions of the embodiments of the present disclosure will be clearly and completely described below with reference to accompanying drawings of the embodiments of the present disclosure. It should be noted that sizes and shapes of each diagram in the accompanying drawings do not reflect a true scale, and are merely intended to illustrate the contents of the present disclosure. In addition, the same or similar reference numerals all the time indicate the same or similar components or components having the same or similar functions.

Unless otherwise defined, technical or scientific terms used herein should have the ordinary meaning as understood by those skills in the art. "First", "second" and similar words used in the specification and claims of the present disclosure do not represent any order, quantity or importance, and are merely used to distinguish different constituent parts. "Comprise" or "include" and similar words mean that elements or objects appearing before the words cover the elements or objects listed after the words and their equivalents, but do not exclude other elements or objects. "Inner", "outer", "up", "down" and the like are merely used to represent a relative position relationship, and after an absolute position of a described object is changed, the relative position relationship may also be changed accordingly.

In the aspect of ultrathin folding screens, ultrathin glass (UTG), as a kind of thinner and harder glass, is not only more resilient than transparent polyimide films (CPI), but also retains a large number of advantages of glass itself. In view of the likely market demand for UTG in the future, the ultrathin folding screens with a fingerprint identification function are the development tendency of future display products.

In related optical fingerprint identification products, in order to enable photosensitive devices to receive as large a semaphore as possible, generally, the larger an area of a photoelectric conversion layer (PIN) in the photosensitive devices, the better, however, in the related art, it is only considered that a collimating light-receiving angle (also called collimation) of a reflection ray of fingerprints in a horizontal direction meets a fingerprint identification requirement, which ignores the problem that fingerprint images in different directions have differences because collimating light-receiving angles in all directions are different, and therefore, fingerprint images identified in the related art are inaccurate.

In order to solve the above technical problems existing in the related art, an embodiment of the present disclosure provides a display substrate, as shown in FIG. 1 to FIG. 10, including:

a base substrate 101;

a plurality of light-emitting devices 102, arranged on the base substrate 101 in an array;

a plurality of photosensitive devices 103, arranged on the base substrate 101 in an array, wherein orthographic projections of the photosensitive devices 103 on the base substrate 101 overlap orthographic projections of gaps (specifically may be gaps between bottom electrodes A included in the light-emitting devices 102) of the light-emitting devices 102 on the base substrate 101, each photosensitive device 103 includes a photoelectric conversion layer PIN, the photoelectric conversion layer PIN included in each photosensitive device 103 may include at least one photoelectric conversion part S, which is equivalent that the photoelectric conversion layers PIN constitute one photoelectric conversion part S, or the photoelectric conversion layers PIN are divided into the plurality of photoelectric conversion parts S, in some embodiments, orthographic projections of the photoelectric conversion parts S on the base substrate 101 are located in the orthographic projections of the gaps between the bottom electrodes A on the base substrate 101; and a black matrix 104, located on a side, away from the base substrate 101, of a layer where the light-emitting devices 102 are located, wherein an orthographic projection of the black matrix 104 on the base substrate 101 overlaps the orthographic projections of the gaps (specifically may be gaps between effective light-emitting function layers of the light-emitting devices 102) of the light-emitting devices 102 on the base substrate 101; the black matrix 104 may have a plurality of first openings $K_1$, orthographic projections of the first openings $K_1$ on the base substrate 101 overlap the orthographic projections of the photoelectric conversion parts S on the base substrate 101, so that the first openings $K_1$ and the photoelectric conversion parts S form a collimating light path, reflection rays of fingerprints are irradiated to the photoelectric conversion parts S through the first openings $K_1$, and a collimating light-receiving angle θ in any direction determined by the first openings $K_1$ and the photoelectric conversion parts S meets a following relation:

$$0° \leq \theta \leq \arctan\left(\frac{P}{2H}\right);$$

wherein

P is a valley-ridge size of fingerprints (namely a distance between centers of two adjacent ridges in the fingerprints, or, a distance between centers of two adjacent valleys in the fingerprints), 200 μm≤P≤500 μm, in the present disclosure, P may be 200 μm to meet the identification of the minimum fingerprint size, and H is a distance between a contact face of the fingerprints and the display substrate and an end face, away from one side of the base substrate 101, of the first openings $K_1$ (which is equivalent to a surface, away from one side of the base substrate 101, of the black matrix 104).

Since a relation of an angle α meeting the fingerprint identification requirement is:

$$\alpha = \arctan\left(\frac{P}{2H}\right),$$

in the above display substrate provided by the embodiment of the present disclosure, the collimating light-receiving angle θ in any direction determined by the first openings $K_1$ and the photoelectric conversion parts S meets the relation of $$0° \leq \theta \leq \arctan\left(\frac{P}{2H}\right),$$

such that the collimating light-receiving angles θ in any direction are all within the scope of α, the requirement of accurately identifying the fingerprints in all directions is guaranteed, and the degree of accuracy of fingerprint identification is effectively improved.

In the above display substrate provided by some embodiments of the present disclosure, the base substrate 101 may be a flexible base substrate, such as a polymide (PI) substrate; or, the base substrate 101 may further be a rigid base substrate, such as a glass substrate.

Optionally, each photosensitive device 103 may further include a first electrode a located between each photoelectric conversion layer PIN and the base substrate 101, and a second electrode (not shown in the figure) located on a side, away from the base substrate 101, of each photoelectric conversion layer PIN. In some embodiments, each photoelectric conversion layer PIN (namely the photoelectric conversion part S) may include a p-type semiconductor layer, an i-type semiconductor layer (also called an intrinsic semiconductor layer) and an n-type semiconductor layer which are stacked. In addition, a one-time composition process may be adopted to form the photoelectric conversion layer PIN and the second electrode (not shown in the figure), and optionally, in order to reduce a leak current, orthographic projections of the second electrodes (not shown in the figure) on the base substrate 101 need to be slightly less than the orthographic projections of the photoelectric conversion layers PIN on the base substrate 101. For example, a distance between an orthographic projection boundary of each second electrode (not shown in the figure) on the base substrate 101 and an orthographic projection boundary of each photoelectric conversion layer PIN on the base substrate 101 may be 0.5 μm~2 μm.

In some embodiments, each light-emitting device 102 may include a bottom electrode A, a light-emitting function layer EL and a top electrode C which are stacked, wherein each light-emitting function layer EL may include but is not limited to a hole injection layer, a hole transport layer, an electronic blocking layer, a light-emitting material layer, a hole blocking layer, an electronic transport layer and an electronic injection layer, and the light-emitting function layer EL located in a pixel opening K of the pixel defining layer 105 is a valid light-emitting function layer of each light-emitting device 102. The light-emitting device 102 in the present disclosure may be a top emission type light-emitting device, the bottom electrode A may be a reflection-type electrode, the top electrode C is a transparent electrode, and each light-emitting device 102 includes but is not limited to a red light device R, a green light device G and a blue light device B.

In some embodiments, the orthographic projection of the black matrix 104 on the base substrate 101 may be located in the orthographic projection of the pixel defining layer 105 on the base substrate 101. The black matrix 104 may further have a plurality of second openings $K_2$, color resistors 106 are arranged in the second openings $K_2$, in order to improve the color purity, an orthographic projection of the pixel openings K on the base substrate 101 may be located in orthographic projections of the second openings $K_2$ on the base substrate 101. Each color resistor 106 may include but is not limited to a red light color resistor, a green light color resistor and a blue light color resistor, wherein the red light device R is arranged below the red light color resistor, the green light device G is arranged below the green light color resistor, and the blue light device B is arranged below the blue light color resistor.

Figure 2:
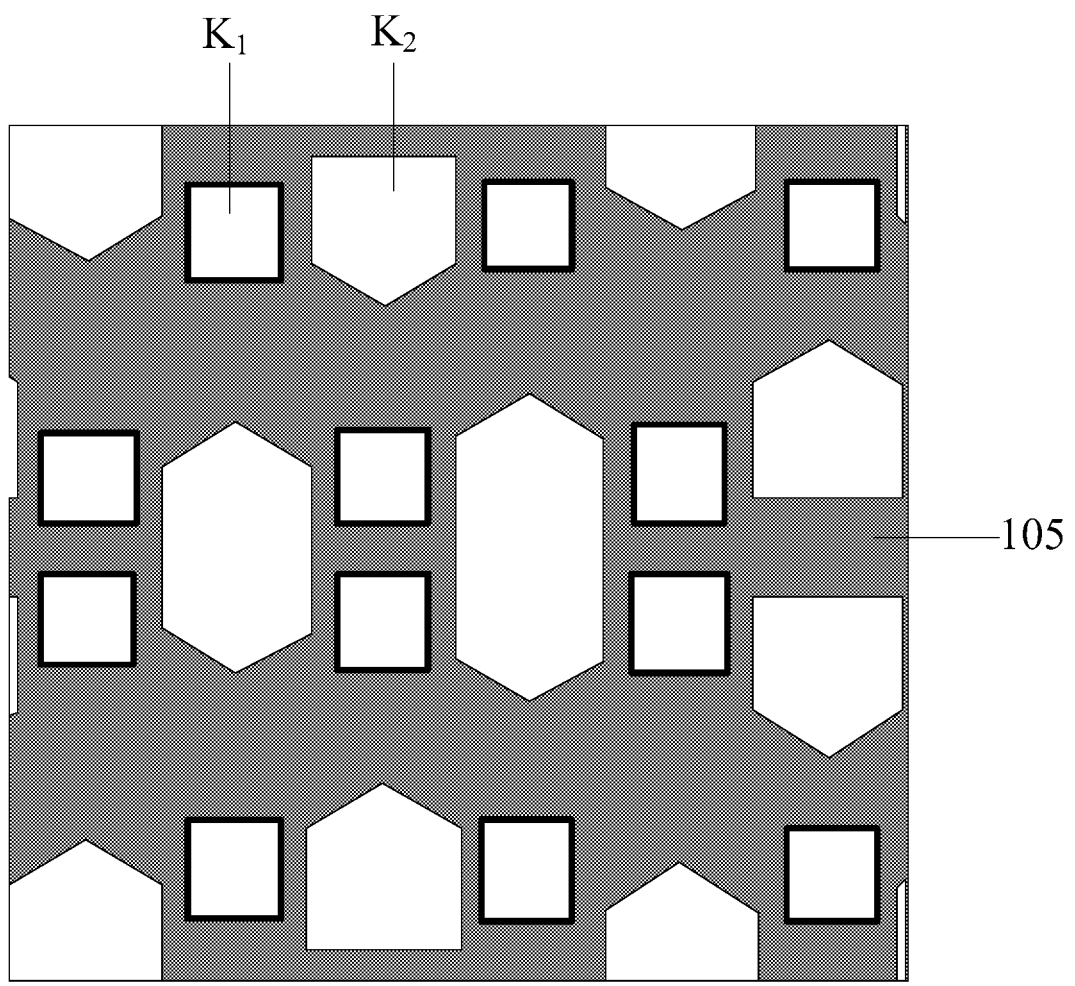
FIG. 2 is a schematic structural diagram of a black matrix in FIG. 1.
Figure 3:
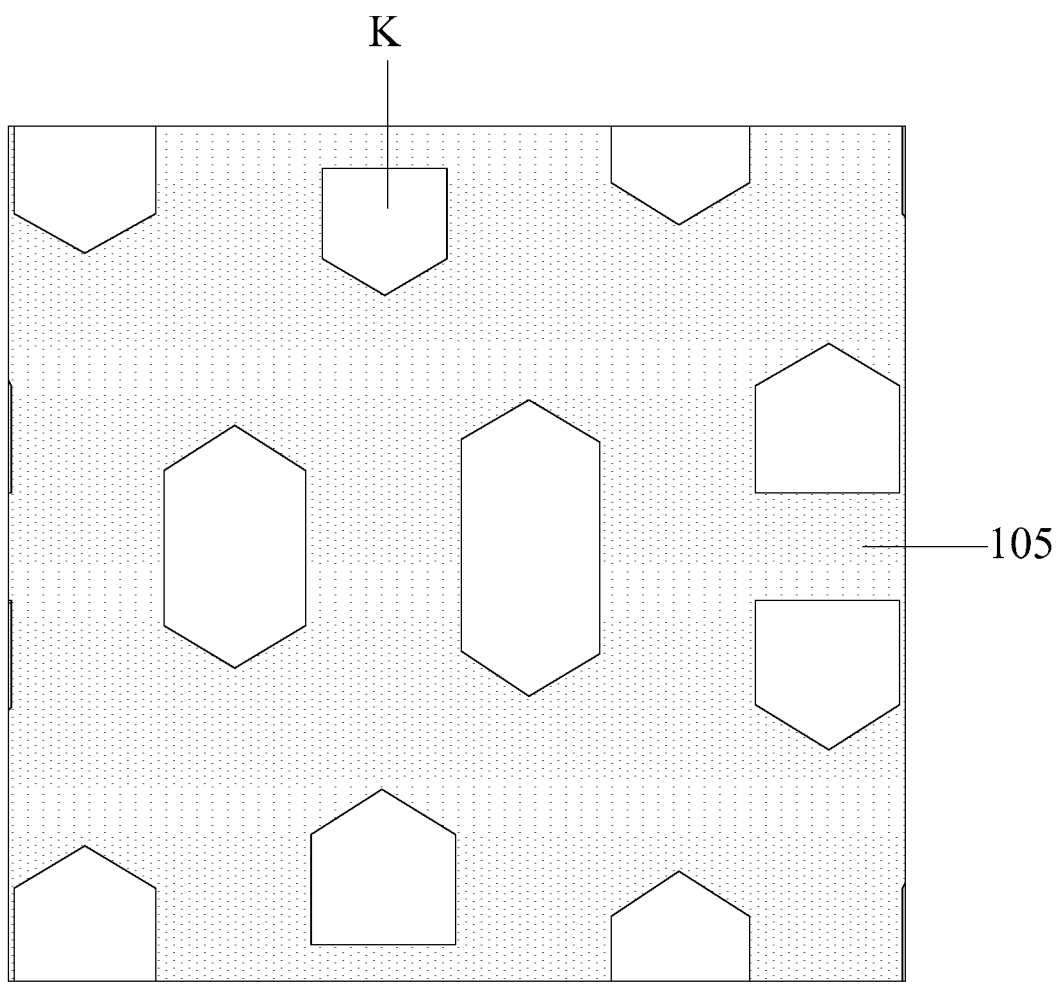
FIG. 3 is a schematic structural diagram of a pixel defining layer in FIG. 1.
Figure 4:
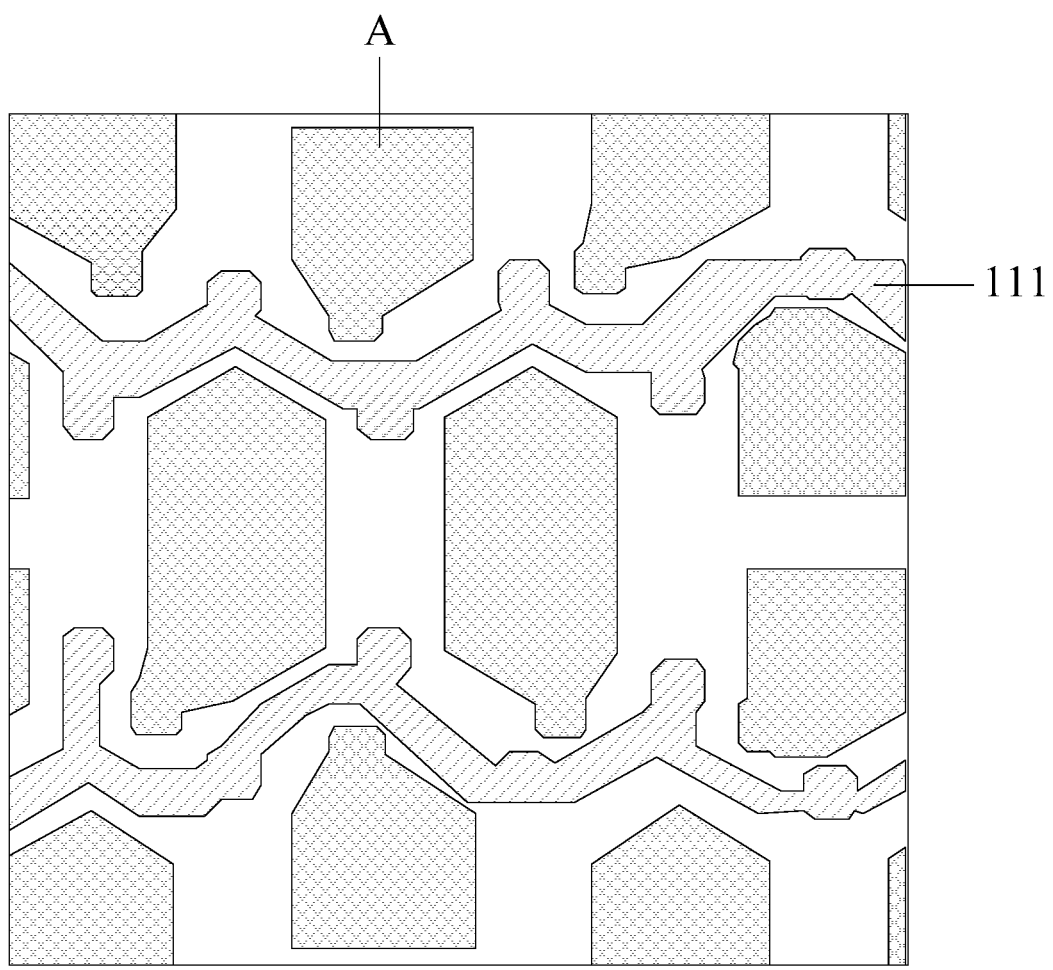
FIG. 4 is a schematic structural diagram of a layer where a bottom electrode is located in FIG. 1.
Figure 5:
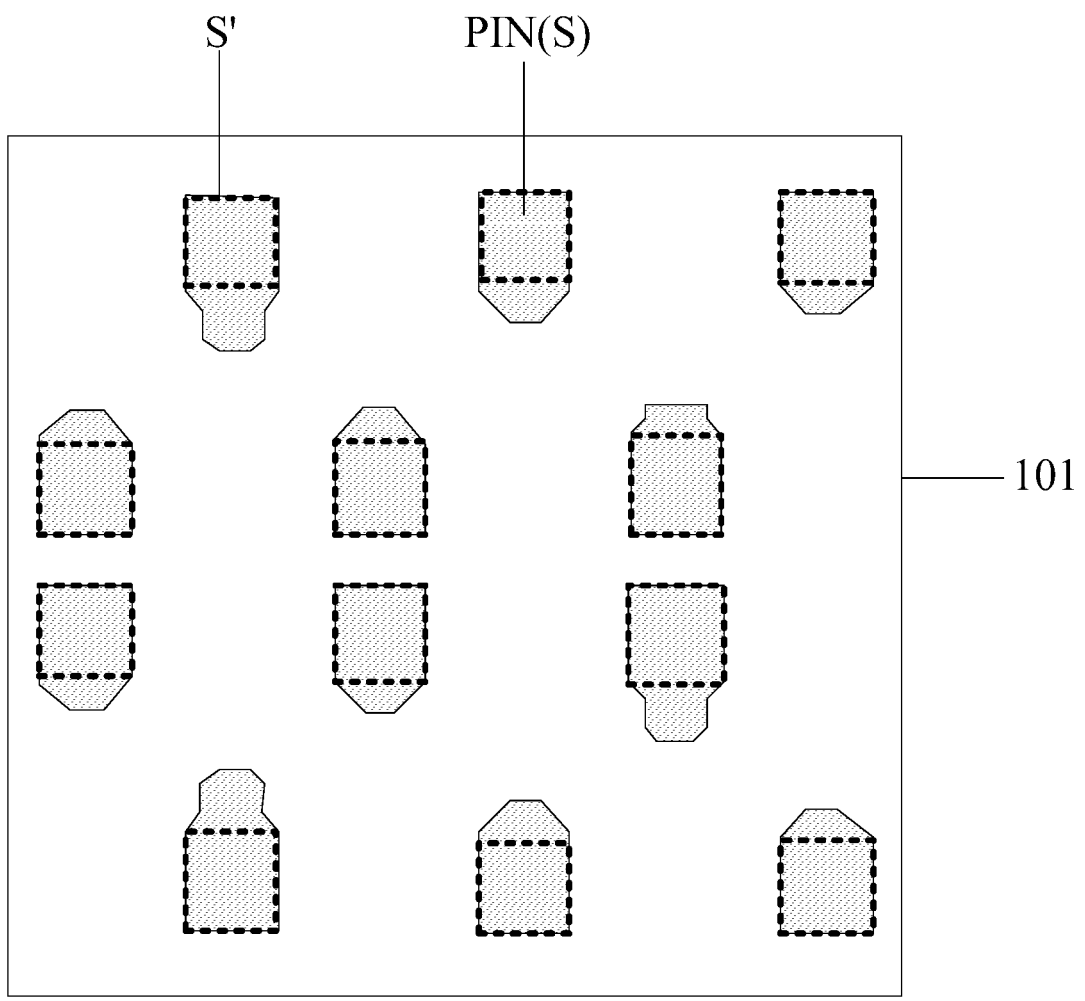
FIG. 5 is a schematic structural diagram of a photoelectric conversion layer in FIG. 1.
Figure 6:
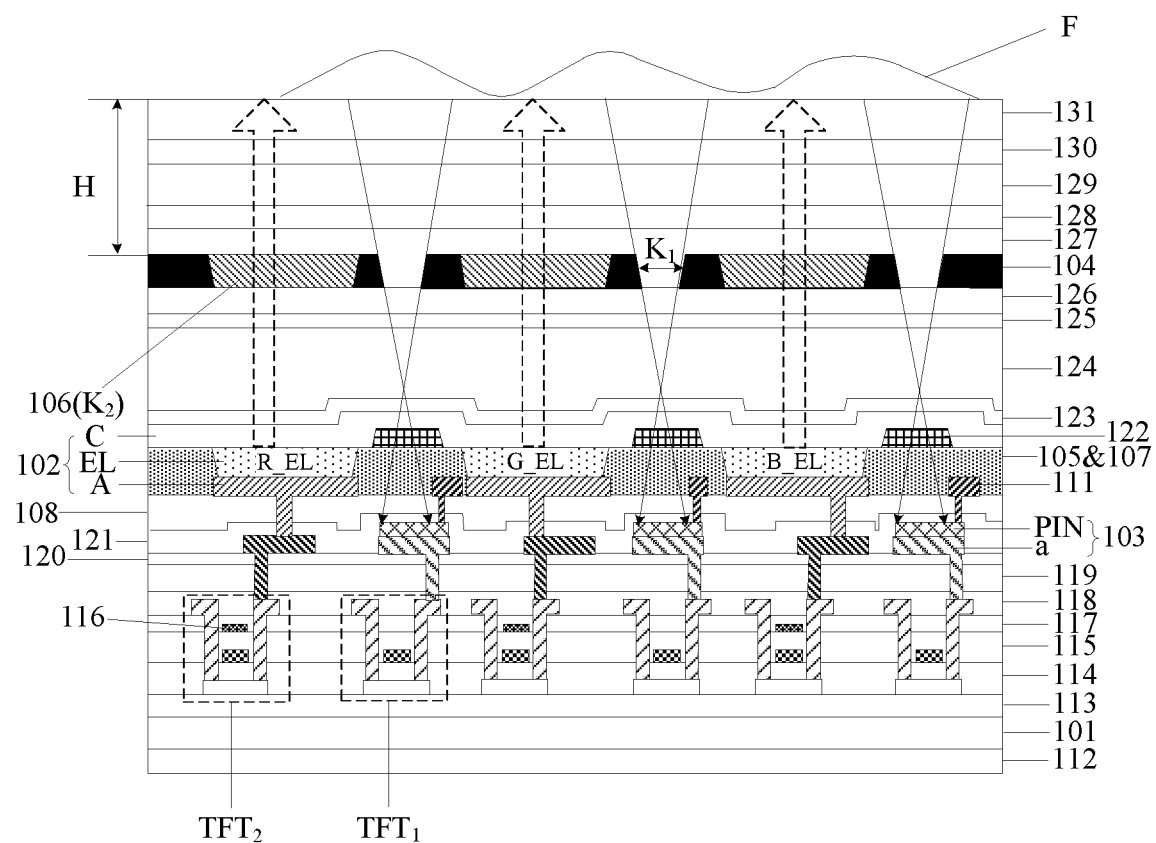
FIG. 6 is yet another schematic structural diagram of a display substrate provided by an embodiment of the present disclosure.
Figure 7:
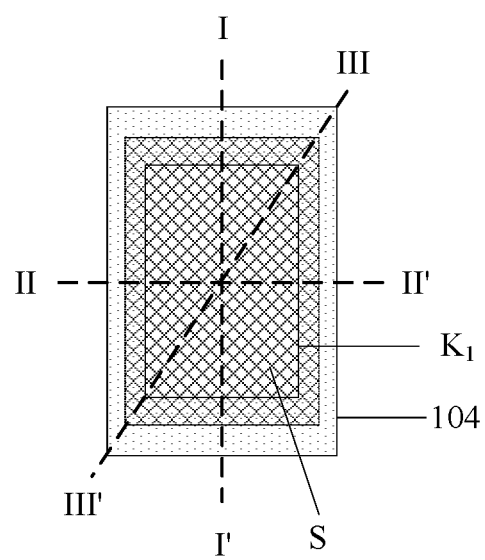
FIG. 7 is a schematic structural diagram of a first opening and a photoelectric conversion part provided by an embodiment of the present disclosure.
Figure 8:
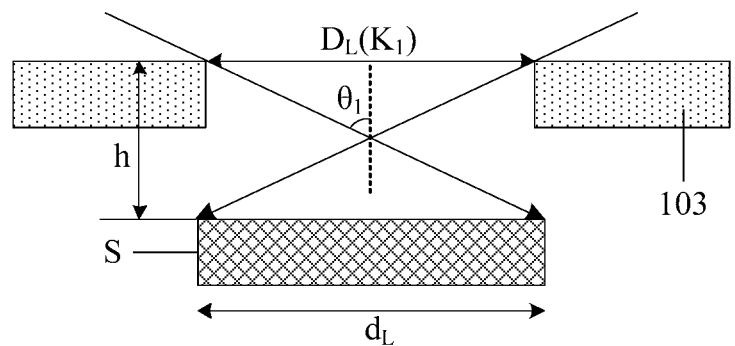
FIG. 8 is a schematic diagram of a collimating light-receiving angle in a long side direction I-I' in FIG. 7.
Figure 9:
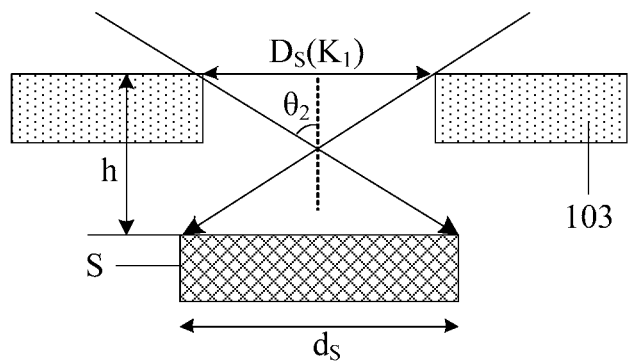
FIG. 9 is a schematic diagram of a collimating light-receiving angle in a broadside direction II-II' in FIG. 7.
Figure 10:
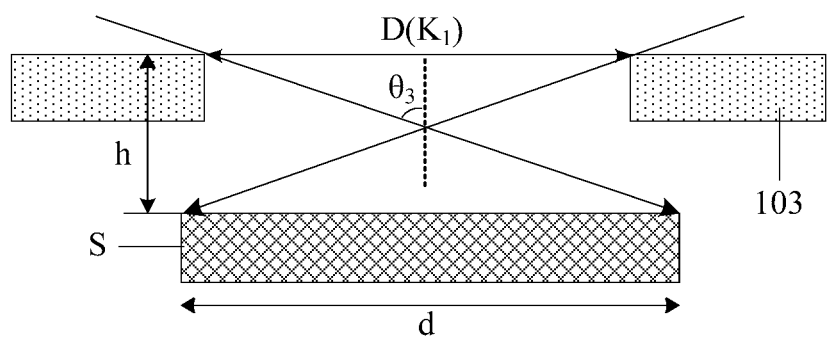
FIG. 10 is a schematic diagram of a collimating light-receiving angle in a diagonal direction III-III' in FIG. 7.
Figure 11:
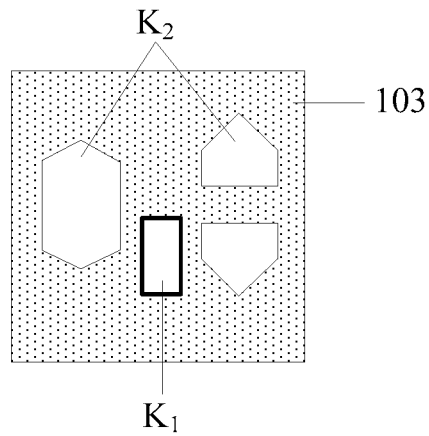
FIG. 11 is a local schematic structural diagram of a black matrix provided by an embodiment of the present disclosure.
Figure 12:
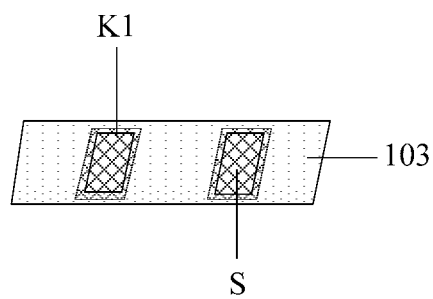
FIG. 12 is yet another schematic structural diagram of a first opening and a photoelectric conversion part provided by an embodiment of the present disclosure.
Figure 13:
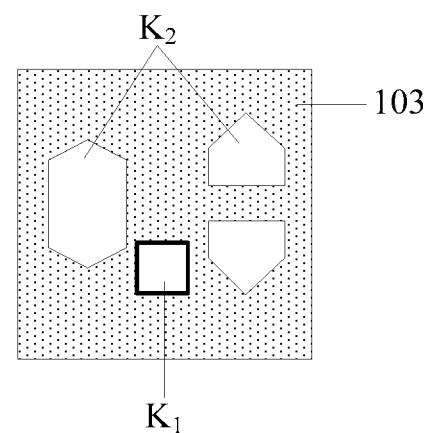
FIG. 13 is yet another local schematic structural diagram of a black matrix provided by an embodiment of the present disclosure.
Figure 14:
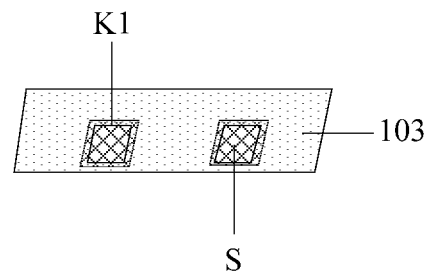
FIG. 14 is yet another schematic structural diagram of a first opening and a photoelectric conversion part provided by an embodiment of the present disclosure.

In the above display substrate provided by some embodiments of the present disclosure, as shown in FIG. 1, FIG. 2 and FIG. 5, the first openings $K_1$ correspond to the photoelectric conversion parts S one to one, in order to ensure that only fingerprint reflection rays transmitted by the first openings $K_1$ are all irradiated to the photoelectric conversion parts S to improve the fingerprint identification quality, the orthographic projections of the photoelectric conversion parts S on the base substrate 101 may be set to completely cover the orthographic projections of the corresponding first openings $K_1$ on the base substrate 101, for example, the orthographic projections of the photoelectric conversion parts S on the base substrate 101 coincide with the orthographic projections of the corresponding first openings $K_1$ on the base substrate 101, or, the orthographic projections of the first openings $K_1$ on the base substrate 101 are located in the orthographic projections of the photoelectric conversion parts S on the base substrate 101. Optionally, in order to improve a central penetration rate of the first openings $K_1$, orthographic projections of centers of the first openings $K_1$ on the base substrate 101 may be set to roughly coincide with orthographic projections of centers of the photoelectric conversion parts S on the base substrate 101, that is, the centers of the first openings $K_1$ and the centers of the photoelectric conversion parts S exactly coincide with each other or are in the skewing scope caused by factors such as manufacturing or measurement.

In the above display substrate provided by some embodiments of the present disclosure, in order to obtain a better collimation effect and improve a signal-to-noise ratio, in the same direction, a ratio of sizes of the first openings $K_1$ to sizes of the photoelectric conversion parts S may be greater than or equal to 0.8 and less than or equal to 1, for example, it may be 0.8, 0.9, 1, etc. Optionally, as shown in FIG. 7 to FIG. 14, taking the situation that shapes of the orthographic projections of centers of the first openings $K_1$ on the base substrate and shapes of the orthographic projections of centers of the photoelectric conversion parts S on the base substrate 101 are all rectangles as an example, in a long side direction I-I' of the rectangles, a ratio of a length $D_L$ of each first opening $K_1$ to a width $d_L$ of each photoelectric conversion part S is $0.8 \leq D_L/d_L \leq 1$; in a broadside direction II-II' of the rectangles, a ratio of a width $D_S$ of each first opening $K_1$ to a width $d_S$ of each photoelectric conversion part S is $0.8 \leq D_S/d_S \leq 1$; and in a diagonal direction III-III' of the rectangle, a ratio of a diagonal D of each first opening $K_1$ to a diagonal d of each photoelectric conversion part S is $0.8 \leq D/d \leq 1$. Accordingly, a collimating light-receiving angle θ₁ in the long side direction I-I', a collimating light-receiving angle θ₂ in the broadside direction II-II' and a collimating light-receiving angle θ₃ in the diagonal direction III-III' of the rectangle determined by the first openings K₁ and the photoelectric conversion parts S meet a following relation:

$$\theta_1 = \arctan\left(\frac{d_L + D_L}{2h}\right);$$

$$\theta_2 = \arctan\left(\frac{d_S + D_S}{2h}\right);$$

$$\theta_3 = \arctan\left(\frac{\sqrt{d_L^2 + d_S^2} + \sqrt{D_L^2 + D_S^2}}{2h}\right);$$

wherein h is a distance between a surface, away from one side of the base substrate 101, of the photoelectric conversion parts S and an end face, away from one side of the base substrate, of the first openings K₁, $d_L$ is a length of each photoelectric conversion part S, $d_S$ is a width of each photoelectric conversion part S, $D_L$ is a length of each first opening K₁, and $D_S$ is a width of each first opening KL.

Since squares belong to rectangles, it can be known in conjunction with the relation of θ1, θ2 and θ3, θ2≤θ1≤θ3, thus in order to enable θ1, θ2 and θ3 to be all greater than or equal to 0° and less than or equal to $$\arctan\left(\frac{P}{2H}\right),$$

only $$0° \leq \theta3 \leq \arctan\left(\frac{P}{2H}\right)$$

is guaranteed.

Since the influence of the collimating light-receiving angle θ₁ in the long side direction I-I' and the collimating light-receiving angle θ₂ in the broadside direction II-II' on fingerprint identification is the largest, in actual design, the collimating light-receiving angle θ₁ in the long side direction I-I' and the collimating light-receiving angle θ₂ in the broadside direction II-II' may be the same or similar, and optionally, in the above display substrate provided by the embodiment of the present disclosure, 1≤$d_L$/$d_S$≤1.3, and 1≤$D_L$/$D_S$≤1.3. In some embodiments, 4 μm≤h≤22 μm, 7 μm≤$d_L$≤14 μm, 7≤$d_S$≤18.2 μm, 5.6 μm≤$D_L$≤14 μm and 5.6 μm≤$D_S$≤18.2 μm.

Figure 15:
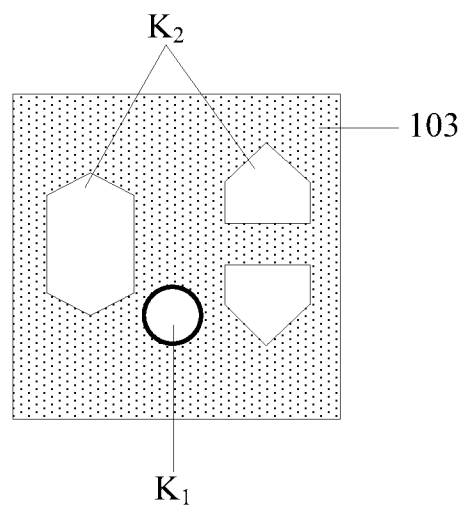
FIG. 15 is yet another local schematic structural diagram of a black matrix provided by an embodiment of the present disclosure.
Figure 16:
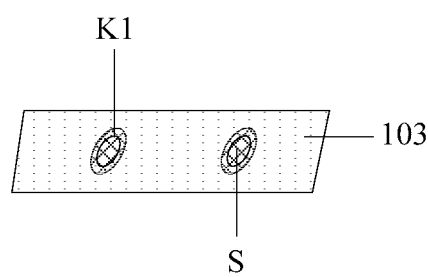
FIG. 16 is yet another schematic structural diagram of a first opening and a photoelectric conversion part provided by an embodiment of the present disclosure.

The above only takes the situation that the shapes of the orthographic projections of the first openings K₁ on the base substrate 101 and the shapes of the orthographic projections of the photoelectric conversion parts S on the base substrate 101 are rectangles as an example, in some embodiments, the shapes of the orthographic projections of the first openings K₁ on the base substrate 101 and the shapes of the orthographic projections of the photoelectric conversion parts S on the base substrate 101 may be all polygons or circles as shown in FIG. 15 and FIG. 16, which is not limited.

In the above display substrate provided by some embodiments of the present disclosure, in the same direction, the ratio of the sizes of the first openings K₁ to the sizes of the photoelectric conversion parts S may further be greater than 0 and less than 0.8. Compared with the solution that the ratio of the sizes of the first openings K₁ to the sizes of the photoelectric conversion parts S is greater than or equal to 0.8 and less than or equal to 1, under the condition of fixing the sizes of the photoelectric conversion parts S, a caliber of each first opening K₁ is smaller, such that it can be ensured that even if the brightness of ambient light is larger, the total quantity of the ambient light irradiated to the photosensitive devices 103 through fingers and the first openings K₁ will not exceed the full trap capacity of the photosensitive devices 103, such that the ambient light may be adopted for fingerprint identification under the condition of the brighter ambient light. Optionally, display light may be adopted for fingerprint identification under the condition that dim ambient light is not enough to identify fingerprints.

Figure 19:
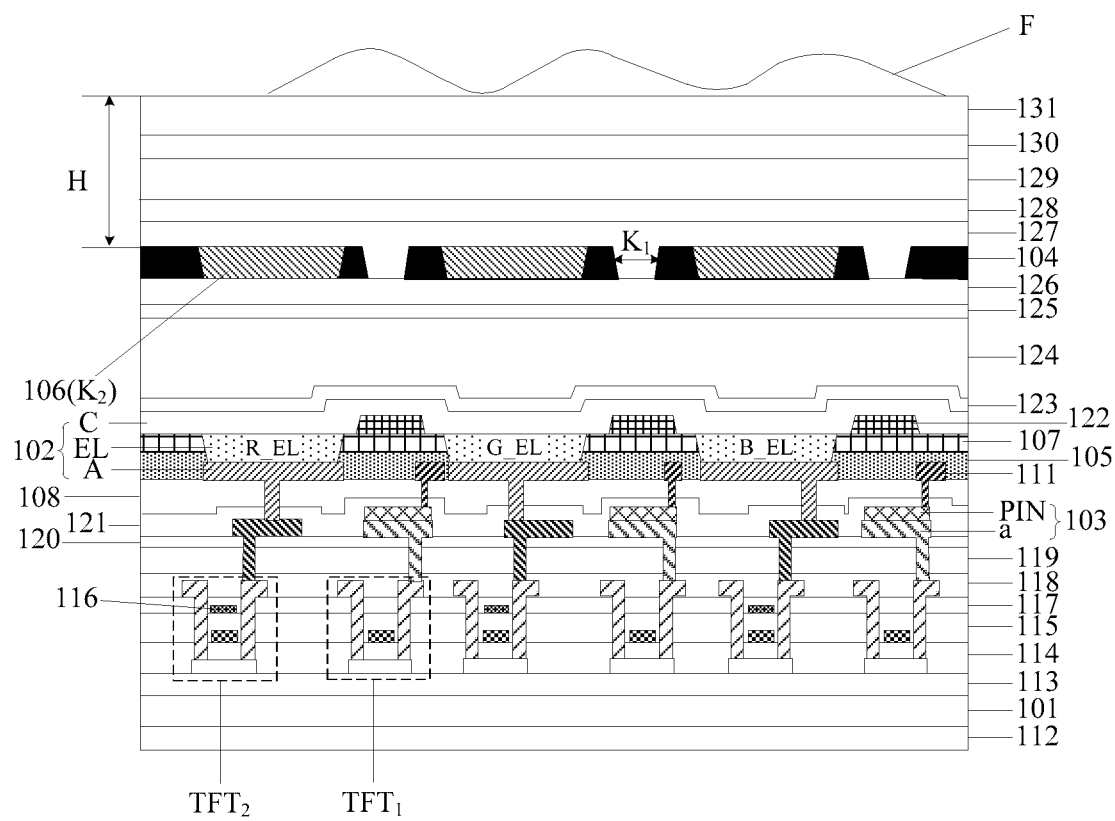
FIG. 19 is yet another schematic structural diagram of a display substrate provided by an embodiment of the present disclosure.
Figure 20:
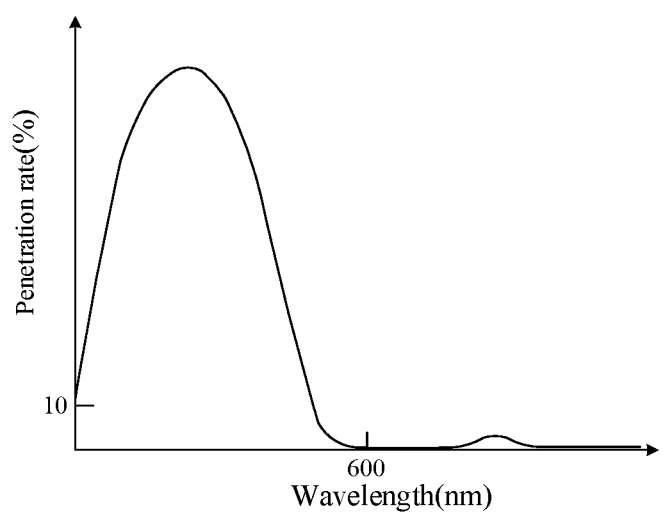
FIG. 20 is a schematic diagram of a spectrum of a filter layer provided by an embodiment of the present disclosure.

In the solution that the ratio of the sizes of the first openings K₁ to the sizes of the photoelectric conversion parts S is greater than or equal to 0.8 and less than or equal to 1, because of the larger first openings K₁, the total quantity of the ambient light irradiated to the photosensitive devices 103 through the fingers and the first openings K₁ will exceed the full trap capacity of the photosensitive devices 103 not to identify the fingerprints under the condition of excessive bright ambient light, and therefore, the display light may be used for fingerprint identification. Accordingly, since light rays greater than 600 nm in the ambient light may penetrate through the fingers, so as shown in FIG. 6, FIG. 17 to FIG. 19, the filter layers 107 may be arranged on a side, away from the base substrate 101, of the photosensitive devices 103, the orthographic projections of the filter layers 107 on the base substrate 101 overlap the orthographic projections of the photoelectric conversion parts S on the base substrate 101, such that the ambient light more than 600 nm may be intercepted by the filter layers 107, and the ambient light is prevented from affecting fingerprint identification. Optionally, as shown in FIG. 20, the comprehensive penetration rate of the filter layers 107 may be greater than or equal to 12% and less than or equal to 40% for light rays greater than or equal to 380 nm and less than or equal to 600 nm, and the comprehensive penetration rate of the filter layers 107 may be less than 0.01% for light rays greater than 600 nm.

Figure 17:
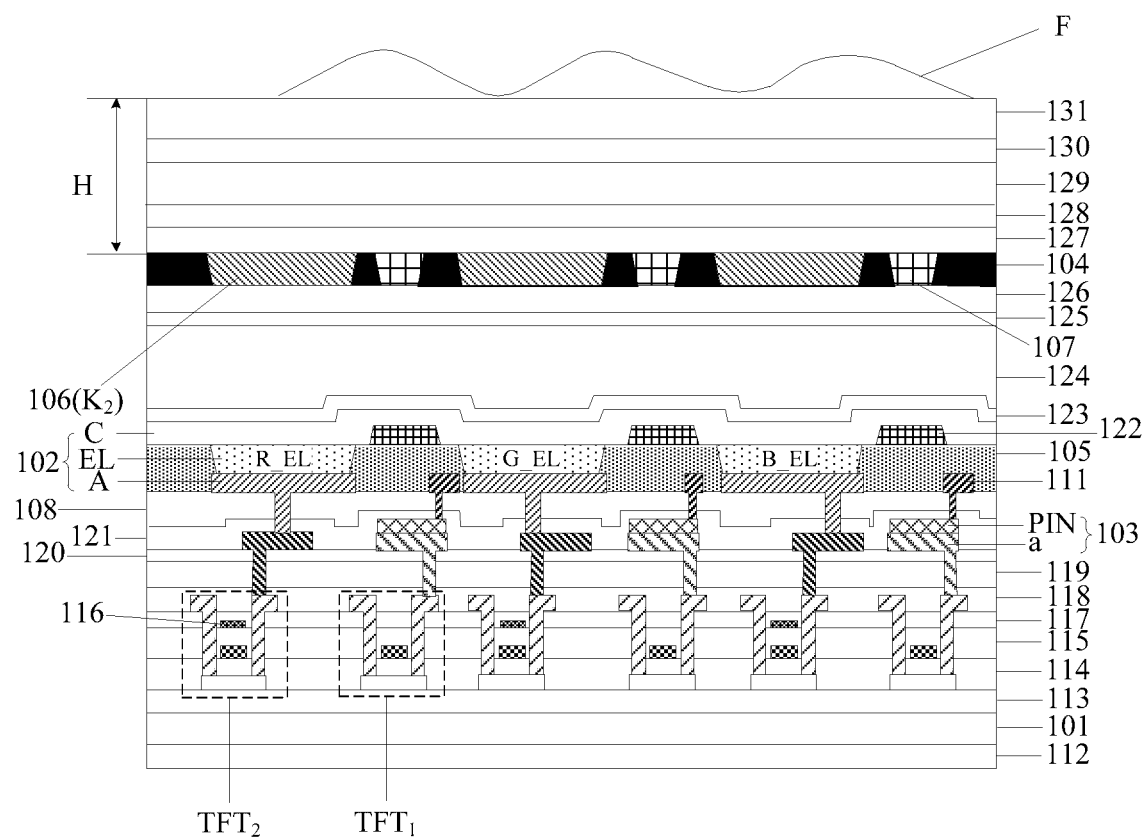
FIG. 17 is yet another schematic structural diagram of a display substrate provided by an embodiment of the present disclosure.
Figure 18:
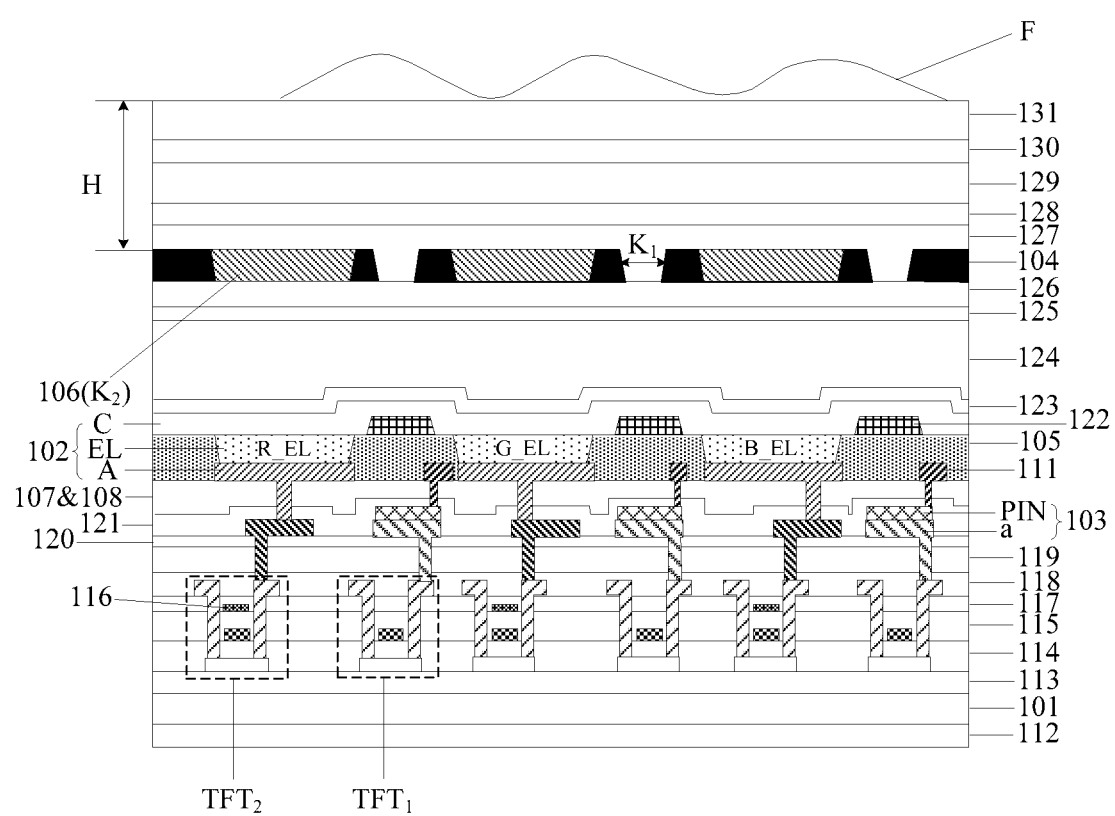
FIG. 18 is yet another schematic structural diagram of a display substrate provided by an embodiment of the present disclosure.

In the above display substrate provided by some embodiments of the present disclosure, as shown in FIG. 17, the filter layers 107 may fill the first openings K₁, and the orthographic projections of the filter layers 107 on the base substrate 101 roughly coincide with the orthographic projections of the first openings K₁ on the base substrate 101, that is, exactly coinciding or in the error scope caused by factors such as manufacturing and measurement. In some embodiments, the filter layers 107 filling the first openings K₁ may be arranged at the same layer with the blue light color resistor, manufacturing of the filter layer 107 and the blue light color resistor is completed by adopting the same masking process, and the masking process of the filter layers 107 is prevented from being additionally increased. In some embodiments, in order to avoid additionally increasing the masking process of the filter layers 107, existing film layers in the filter layers 107 and the display substrate may further be reused, for example, in FIG. 6, the filter layers 107 and the pixel defining layer 105 for defining the light-emitting device 102 are reused, and in FIG. 18, the filter layers 107 and the first flatting layer 108 between the layer where the photosensitive devices 103 are located and the layer where the light-emitting devices 102 are located are reused. Certainly, in some embodiments, the filter layers 107 may further be separately manufactured, as shown in FIG. 19, the filter layers 107 may be arranged between the pixel defining layer 105 and the light-emitting function layer EL of each light-emitting device 102, and the orthographic projections of the filter layers 107 on the base substrate 101 are located in the orthographic projection of the pixel defining layer 105 on the base substrate 101. Under the condition that the existing film layer in the filter layer 107 and the display substrate is reused or separately arranged, materials of the filter layers 107 may be the same as those of the blue light color resistor, and thus the ambient light penetrating through the fingers being greater than 600 nm and less than or equal to 780 nm is effectively attenuated.

In some embodiments, under the condition of using the display light for fingerprint identification, when a finger F is in contact with the upper surface of the display substrate, light rays are emitted by controlling a lightening surface light source of each light-emitting device 102, after the light rays are emitted from the light-emitting function layers EL, after the light rays reach a fingerprint interface (namely a contact interface of the finger and the upper surface of the display substrate) upwards through the film layers between the light-emitting function layers EL and the upper surface of the display substrate, reflection occurs on the fingerprint interface, the reflected light rays reach the photoelectric conversion layers PIN through the film layers between the photoelectric conversion layers PIN and the upper surface of the display substrate, the photoelectric conversion layers PIN convert the light rays reflected by the fingerprints to electric signals, and since signals reflected by fingerprint valley and ridge are different, fingerprint identification may be realized. Under the condition of using the ambient light for fingerprint identification, when the finger F is in contact with the upper surface of the display substrate, external ambient light penetrates through the finger F to reach the photoelectric conversion layers PIN downwards through the film layers between the photoelectric conversion layers PIN and the upper surface of the display substrate, the photoelectric conversion layers PIN convert the light rays reflected by the fingerprints to the electric signals, and since the signals reflected by the fingerprint valley and ridge are different, fingerprint identification may be realized.

Figure 26:
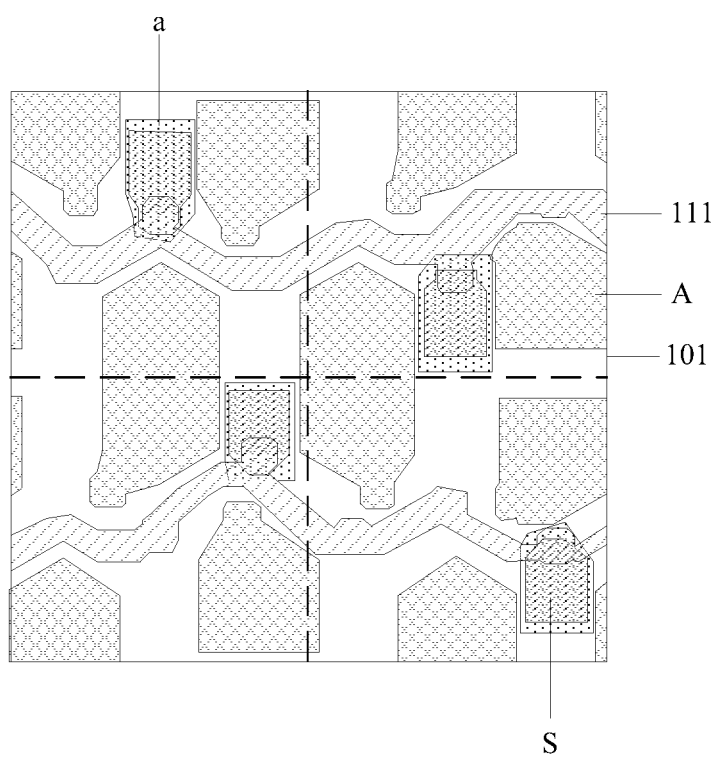
FIG. 26 is yet another schematic structural diagram of a region where four photosensitive devices are located provided by an embodiment of the present disclosure.
Figure 27:
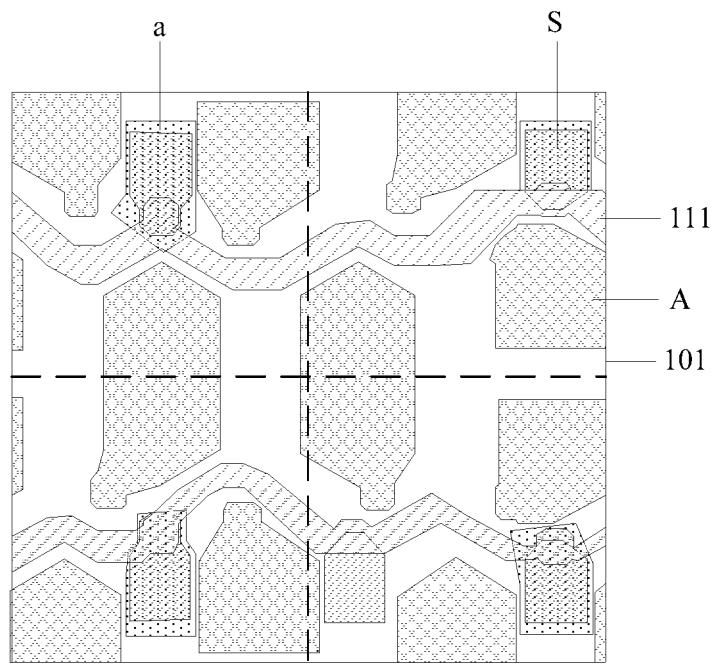
FIG. 27 is yet another schematic structural diagram of a region where four photosensitive devices are located provided by an embodiment of the present disclosure.
Figure 28:
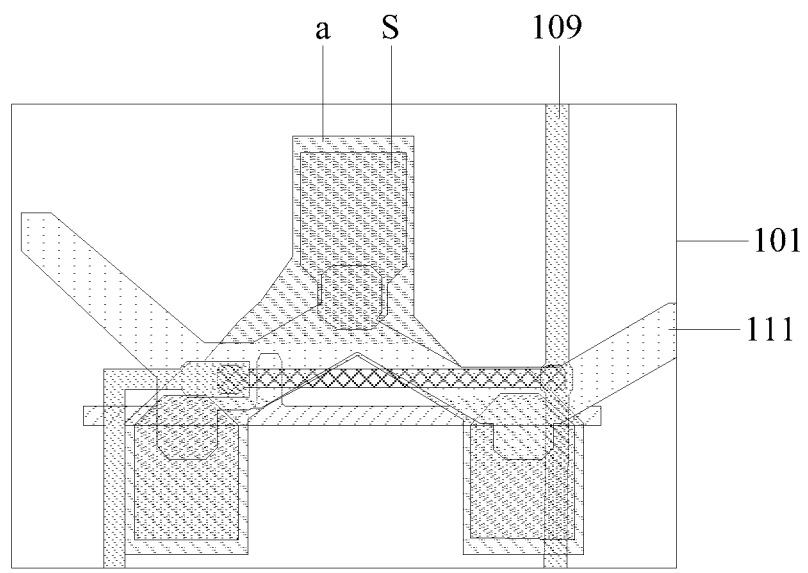
FIG. 28 is a schematic structural diagram of a region where a photosensitive device is located provided by an embodiment of the present disclosure.

In the above display substrate provided by some embodiments of the present disclosure, as shown in FIG. 21 to FIG. 25, the photoelectric conversion layer PIN of each photosensitive device 103 may include the plurality of photoelectric conversion parts S (for example, a first photoelectric conversion part $S_1$, a second photoelectric conversion part $S_2$ and a third photoelectric conversion part $S_3$ are included), the orthographic projections of the photoelectric conversion parts S (such as a valid sensitizing area S' of the photoelectric conversion parts S as shown in FIG. 5) on the base substrate 101 are the same in shape and equal in area (such as the valid sensitizing area S' as shown in FIG. 5), so that it is ensured that the valid sensitizing areas of the pixel regions where the photosensitive devices 103 are located are consistent. Certainly, in some embodiments, as shown in FIG. 26 and FIG. 27, the photoelectric conversion layer PIN of each photosensitive device 103 may only have one photoelectric conversion part S.

Figure 21:
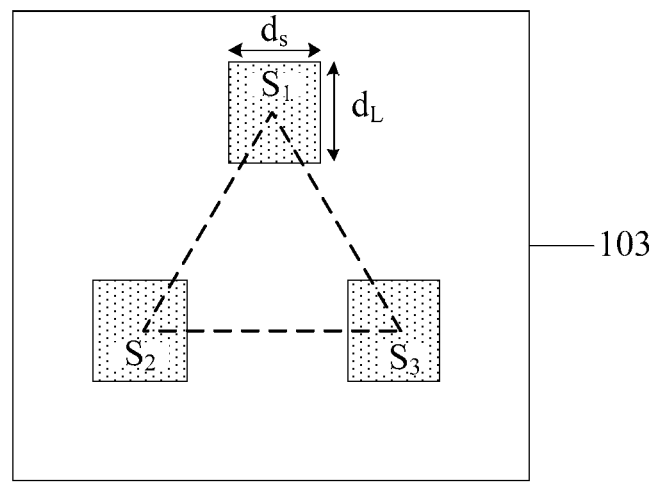
FIG. 21 is a schematic structural diagram of a photoelectric conversion part contained in a photosensitive device provided by an embodiment of the present disclosure.

In the above display substrate provided by some embodiments of the present disclosure, in order to enable the sensitizing areas of the photosensitive devices 103 to be distributed uniformly to improve the uniformity of fingerprint imaging, as shown in FIG. 21, the plurality of photoelectric conversion parts S in the same photosensitive device 103 may be rotationally symmetric with respect to the centers of the photosensitive devices 103. Exemplarily, as shown in FIG. 21, in the same photosensitive device 103, each photoelectric conversion layer PIN includes the three photoelectric conversion parts S (for example, the first photoelectric conversion part $S_1$, the second photoelectric conversion part $S_2$ and the third photoelectric conversion part $S_3$ are included), and the photoelectric conversion parts S may be rotationally symmetric with respect to the centers of the photosensitive devices 103, so that the central lines of the photoelectric conversion parts S constitute an equilateral triangle.

Figure 22:
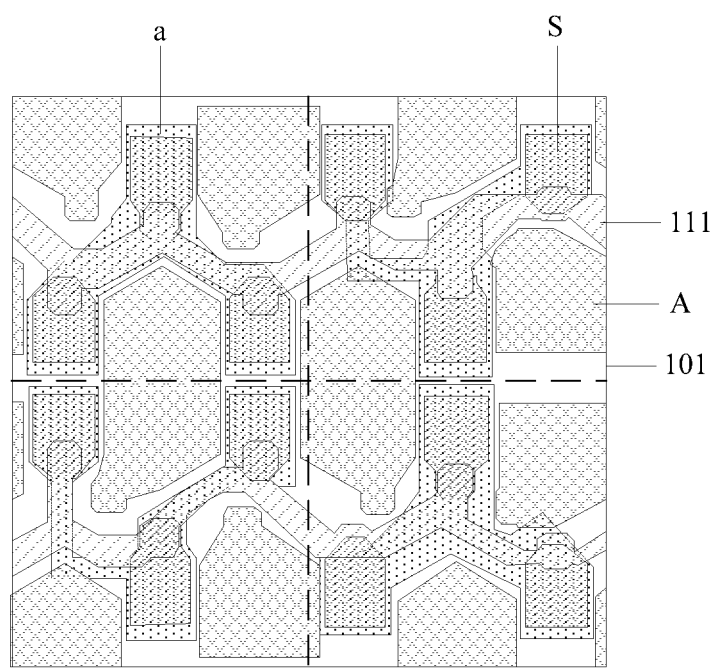
FIG. 22 is a schematic structural diagram of a region where four photosensitive devices are located provided by an embodiment of the present disclosure.
Figure 23:
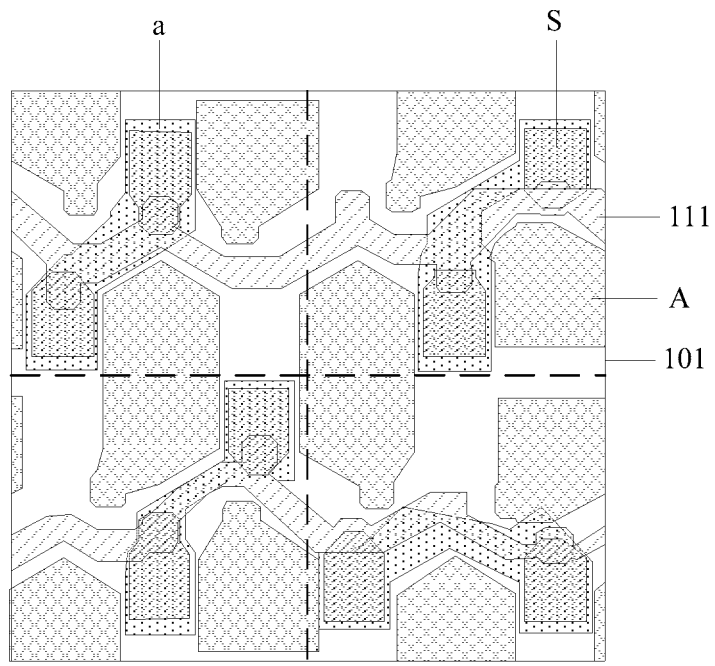
FIG. 23 is yet another schematic structural diagram of a region where four photosensitive devices are located provided by an embodiment of the present disclosure.
Figure 24:
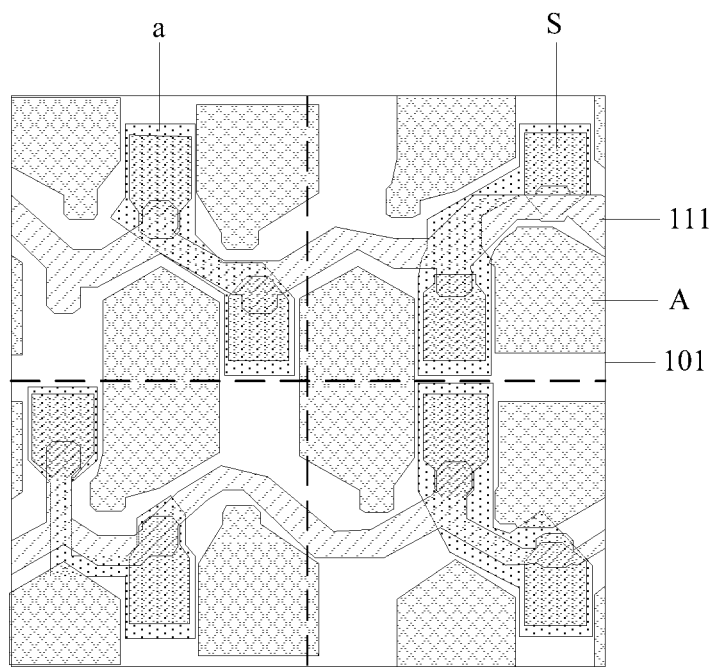
FIG. 24 is yet another schematic structural diagram of a region where four photosensitive devices are located provided by an embodiment of the present disclosure.
Figure 25:
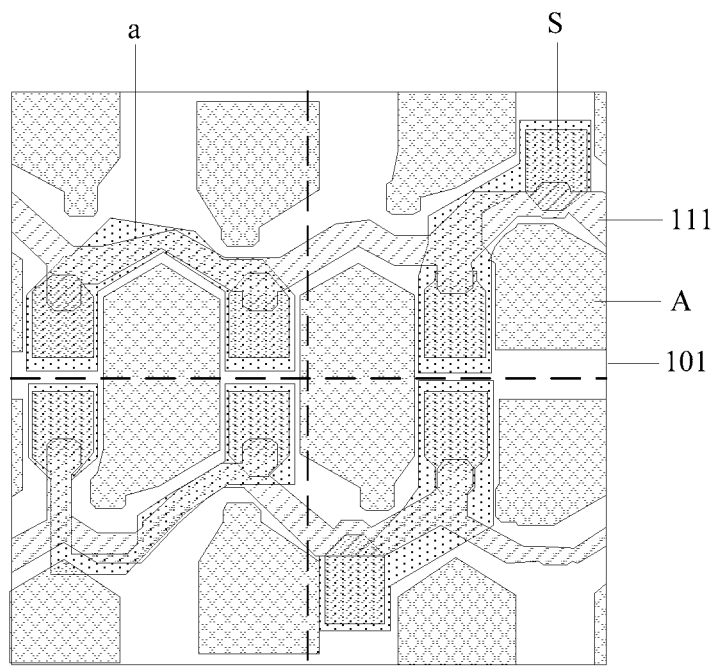
FIG. 25 is yet another schematic structural diagram of a region where four photosensitive devices are located provided by an embodiment of the present disclosure.

In the above display substrate provided by embodiments of the present disclosure, as shown in FIG. 22, the four photosensitive devices 103 in every two adjacent rows and columns are a repetitive unit. Optionally, in FIG. 22, four regions are divided from two transverse and longitudinal dotted lines, each region has one photosensitive device 103, the photoelectric conversion parts S in the repetitive unit may be rotationally symmetric with respect to a center of the repetitive unit, so that the photoelectric conversion parts S are distributed uniformly on the display substrate, which is beneficial to improving the effect of fingerprint identification.

Figure 29:
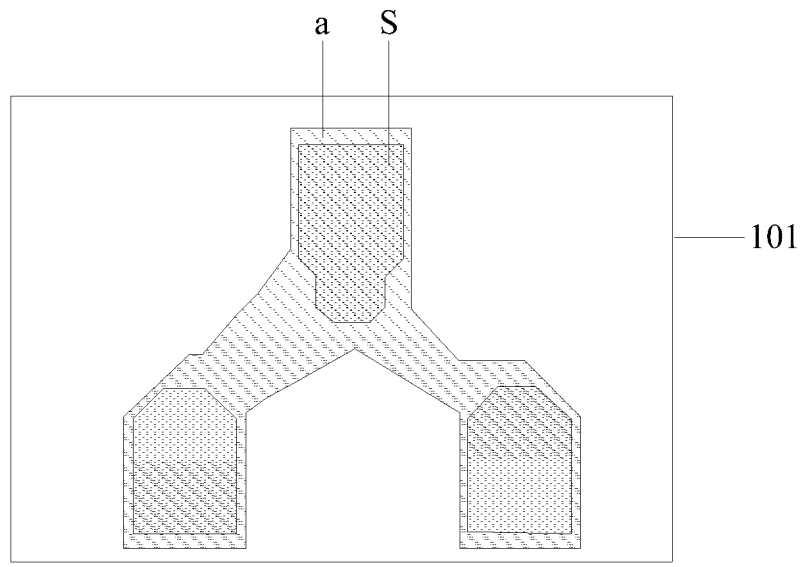
FIG. 29 is a schematic structural diagram of a first electrode and a photoelectric conversion part in FIG. 28.
Figure 30:
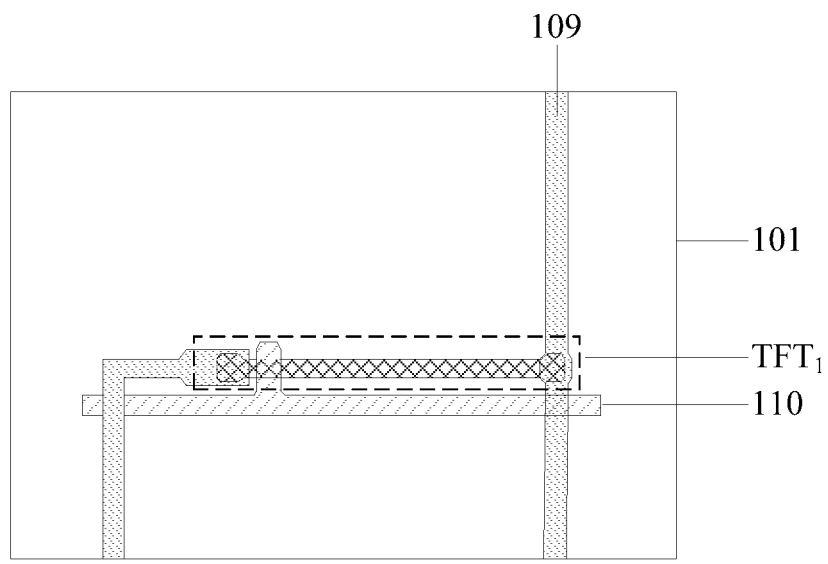
FIG. 30 is a schematic structural diagram of a layer where a first transistor is located in FIG. 28.

In the above display substrate provided by some embodiments of the present disclosure, as shown in FIG. 22 to FIG. 28, in the same photosensitive device 103, the orthographic projections of all the photoelectric conversion parts S on the base substrate 101 are located in orthographic projections of the first electrodes a on the base substrate 101, which is beneficial to outputting the electric signals converted by all the photoelectric conversion parts S included by the same photosensitive device 103 through the first electrodes a. Optionally, the first electrodes a are electrically connected with a first transistor $TFT_1$, it can be seen from FIG. 28 to FIG. 30, the orthographic projections of the first electrodes a on the base substrate 101 and orthographic projections of the first transistor $TFT_1$, a reading line 109 and a grid line 110 on the base substrate 101 overlap to a certain degree, so that a coupling capacitance and mutual interference are formed among the first electrodes a, the first transistor $TFT_1$, the reading line 109 and the grid line 110. Therefore, during specific implementation, the overlap area of the first electrodes a, the first transistor $TFT_1$, the reading line 109, the grid line 110 and the like should be ensured the smaller the better as much as possible. Apparently, compared with the condition that each photosensitive device 103 includes the plurality of photoelectric conversion parts S, each photosensitive device 103 only includes one photoelectric conversion part S, which is more beneficial to avoiding overlapping among the first electrodes a, the first transistor $TFT_1$, the reading line 109 and the grid line 110.

In some embodiments, as shown in FIG. 22 to FIG. 28, the display substrate may further include a bias line 111 electrically connected with a top electrode (not shown in the figure) of each photosensitive device 103, optionally, as shown in FIG. 6, FIG. 17 to FIG. 19, the bias lines 111 may be arranged at the same layer with bottom electrodes A of the light-emitting devices 102, so that the same masking process is adopted to complete manufacturing of the bias lines 111 and the bottom electrodes A, and the masking process of the bias lines 111 is prevented from being additionally increased. The bias lines 111 need to be electrically connected with second electrodes of the photosensitive devices 103, orthographic projections of the second electrodes are located in the orthographic projections of the photoelectric conversion parts S, thus, the bias lines 111 will shield part of areas of the photoelectric conversion parts S, however, the areas of the photoelectric conversion parts S not shielded by the bias lines 111 constitute the valid sensitizing areas S' (as shown in FIG. 5) of the photoelectric conversion parts S; and at the moment, in the present disclosure, the sizes of the photoelectric conversion parts S may be specifically equivalent to the sizes of the valid sensitizing areas S' of the photoelectric conversion parts S. Certainly, in some embodiments, all the areas of the of the photoelectric conversion parts S may further be as the valid sensitizing areas S', and the photoelectric conversion layers PIN outside the photoelectric conversion parts S are as a supporting part for bearing a through hole for connecting the second electrodes and the bias lines 111; and in this case, in the present disclosure, the sizes of the photoelectric conversion parts S are own actual sizes.

In addition, in some embodiments, as shown in FIG. 6, FIG. 17 to FIG. 19, the display substrate may further include a second transistor $TFT_2$, a back film 112, a buffer layer 113, a first grid insulating layer 114, a second grid insulating layer 115, a second grid metal layer 116, an interlayer dielectric layer 117, a first insulating layer 118, a second flatting layer 119, a second insulating layer 120, a protection layer 121, a supporting layer 122, a first inorganic encapsulation layer 123, an organic encapsulation layer 124, a second inorganic encapsulation layer 125, a third flatting player 126, a fourth flatting layer 127, a first adhesive layer 128, an ultra-thin glass layer 129, a second adhesive layer 130 and a polyester film layer 131 electrically connected with the light-emitting device 102. Other essential components of the display substrate should be understood by those ordinary skill in the art, which is not repeated here, and nor shall be taken as a limitation of the present disclosure.

Based on the same inventive concept, an embodiment of the present disclosure provides a display apparatus, including the above display substrate provided by embodiments of the present disclosure. Since the principle of the display apparatus for solving the problem is similar to the principle of the above display substrate for solving the problem, the implementation of the display apparatus provided by the embodiments of the present disclosure may refer to the implementation of the above display substrate provided by the embodiments of the present disclosure, and repetition is omitted.

In some embodiments, the above display apparatus provided by the embodiment of the present disclosure may be a mobile phone, a tablet personnel computer, a television, a display, a notebook computer, a digital photo frame, a navigator, an intelligent watch, a fitness bracelet, a personnel digital assistant and any product or component with a display function. The display apparatus includes but is not limited to a radio frequency unit, a network module, an audio output & input unit, a sensor, a display unit, a user input unit, an interface unit, a memory, a processor, a power source and other components. In addition, those ordinarily skill in the art may understand that the above structure does not constitute the limitation of the above display apparatus provided by the embodiment of the present disclosure, in other words, the above display apparatus provided by the embodiment of the present disclosure may include more or less components, or a combination of some components, or different components.

Apparently, those ordinarily skill in the art may make various modifications and variations on embodiments of the present disclosure without departing from the spirit or scope of the present disclosure. In this way, if these modifications and variations of the present disclosure fall within the scope of the claims of the present disclosure and their equivalent art, the present disclosure also intends to include these modifications and variations.

What is claimed is:

1. A display substrate, comprising:
a base substrate;
a plurality of light-emitting devices arranged on the base substrate in an array;
a plurality of photosensitive devices arranged on the base substrate in an array, wherein an orthographic projection of each of the plurality of photosensitive devices on the base substrate overlaps an orthographic projection of each gap between two adjacent light-emitting devices among the plurality of light-emitting devices on the base substrate, the plurality of photosensitive devices comprise a photoelectric conversion layer, the photoelectric conversion layer comprises a plurality of photoelectric conversion parts, and orthographic projections of the plurality of photoelectric conversion parts on the base substrate are same in shape and equal in area; and
a black matrix on a side, away from the base substrate, of a layer where the light-emitting devices are, wherein an orthographic projection of the black matrix on the base substrate overlaps the orthographic projection of the each gap between two adjacent light-emitting devices among the plurality of light-emitting devices on the base substrate, the black matrix comprises a plurality of openings, and an orthographic projection of each of the plurality of openings on the base substrate overlaps an orthographic projection of each of the plurality of photoelectric conversion parts on the base substrate; and a collimating light-receiving angle θ in any direction determined by the openings and the photoelectric conversion parts meets a following relation:

$$0° \le \theta \le \arctan\left(\frac{P}{2H}\right);$$

wherein
P is a valley-ridge size of a fingerprint, and H is a distance between a contact face of the fingerprint and the display substrate and an end face, away from one side of the base substrate, of the openings.

2. The display substrate according to claim 1, wherein the plurality of openings correspond to the photoelectric conversion parts in an one-to-one manner, an orthographic projection of each of the photoelectric conversion parts on the base substrate covers an orthographic projection of a corresponding opening on the base substrate, and an orthographic projection of a center of each of the plurality of openings on the base substrate approximately coincide with an orthographic projection of a center of the corresponding photoelectric conversion part on the base substrate.

3. The display substrate according to claim 1, wherein in a same direction, a ratio of a size of each of the plurality of openings to a size of each of the photoelectric conversion parts is greater than or equal to 0.8 and less than or equal to 1.

4. The display substrate according to claim 3, wherein shapes of orthographic projections of the plurality of openings on the base substrate and shapes of the orthographic projections of the photoelectric conversion parts on the base substrate are rectangles;
a collimating light-receiving angle $\theta_1$ in a long side direction of the rectangles, a collimating light-receiving angle $\theta_2$ in a broadside direction of the rectangles and a collimating light-receiving angle $\theta_3$ in a diagonal direction of the rectangles are determined by the plurality of openings and the photoelectric conversion parts and meet a following relation:

$$\theta_1 = \arctan\left(\frac{d_L + D_L}{2h}\right);$$

$$\theta_2 = \arctan\left(\frac{d_S + D_S}{2h}\right);$$

$$\theta_3 = \arctan\left(\frac{\sqrt{d_L^2 + d_S^2} + \sqrt{D_L^2 + D_S^2}}{2h}\right);$$

wherein
h is a distance between a surface, away from one side of the base substrate, of the photoelectric conversion parts and an end face, away from one side of the base substrate, of the plurality of openings, $d_L$ is a length of each of the photoelectric conversion parts, $d_S$ is a width of each of the photoelectric conversion parts, $D_L$ is a length of each of the plurality of openings, and $D_S$ is a width of each of the plurality of openings.

5. The display substrate according to claim 4, wherein $1 \leq d_L/d_S \leq 1.3$, and $1 \leq D_L/D_S \leq 1.3$.

6. The display substrate according to claim 4, wherein 200 µm≤P≤500 µm, 4 µm≤h≤22 µm, 7 µm≤$d_L$≤14 µm, 7≤$d_S$≤18.2 µm, 5.6 µm≤$D_L$≤14 µm, and 5.6 µm≤$D_S$≤18.2 µm.

7. The display substrate according to claim 3, wherein shapes of the orthographic projections of the plurality of openings on the base substrate and shapes of the orthographic projections of the photoelectric conversion parts on the base substrate are polygons or circles.

8. The display substrate according to claim 1, wherein in a same direction, a ratio of a size of each of the plurality of openings to a size of each of the photoelectric conversion parts is greater than 0 and less than 0.8.

9. The display substrate according to claim 1, wherein in a same photosensitive device, the plurality of photoelectric conversion parts are rotationally symmetric with respect to a center of the same photosensitive device.

10. The display substrate according to claim 9, wherein in the same photosensitive device, the photoelectric conversion layer comprises three photoelectric conversion parts, and central lines of the three photoelectric conversion parts constitute an equilateral triangle.

11. The display substrate according to claim 10, wherein four photosensitive devices in every two adjacent rows and every two adjacent columns are a repetitive unit, and photoelectric conversion parts in the repetitive unit are rotationally symmetric with respect to a center of the repetitive unit.

12. The display substrate according to claim 1, wherein each of the plurality of photosensitive devices comprises a first electrode; and in each of the plurality of photosensitive devices, an orthographic projection of the photoelectric conversion part on the base substrate is within an orthographic projection of the first electrode on the base substrate.

13. The display substrate according to claim 1, further comprising a filter layer on a side, away from the base substrate, of each of the plurality of photosensitive devices, wherein an orthographic projection of the filter layer on the base substrate overlaps an orthographic projection of the photoelectric conversion part on the base substrate, and the filter layer is configured to intercept ambient light above 600 nm.

14. The display substrate according to claim 13, wherein the filter layer fill the plurality of openings, and the orthographic projection of the filter layer on the base substrate approximately coincides with the orthographic projections of the plurality of openings on the base substrate.

15. The display substrate according to claim 14, further comprising a blue light color resistor on a side, away from the base substrate, of the black matrix, wherein the filter layer and the blue light color resistor are arranged at a same layer.

16. The display substrate according to claim 15, further comprising a pixel defining layer arranged between a layer where a bottom electrode of each of the plurality of light-emitting devices is and a layer where a light-emitting function layer of each of the plurality of light-emitting devices is, wherein the pixel defining layer is reused as the filter layer.

17. The display substrate according to claim 13, further comprising a pixel defining layer arranged between a layer where a bottom electrode of each of the plurality of light-emitting devices is and a layer where a light-emitting function layer of each of the plurality of light-emitting devices is; wherein
the filter layer is between the pixel defining layer and the light-emitting function layer of each of the plurality of light-emitting devices, and the orthographic projection of the filter layer on the base substrate is within an orthographic projection of the pixel defining layer on the base substrate.

18. The display substrate according to claim 13, further comprising a flatting layer arranged between a layer where the plurality of photosensitive device are and a layer where the plurality of light-emitting devices are, wherein the flatting layer is reused as the filter layer.

19. A display apparatus, comprising the display substrate according to claim 1.

20. A display substrate, comprising:
a base substrate;
a plurality of light-emitting devices arranged on the base substrate in an array;
a plurality of photosensitive devices arranged on the base substrate in an array, wherein an orthographic projection of each of the plurality of photosensitive devices on the base substrate overlaps an orthographic projection of each gap between two adjacent light-emitting devices among the plurality of light-emitting devices on the base substrate, the plurality of photosensitive devices comprise a photoelectric conversion layer, the photoelectric conversion layer comprises at least one photoelectric conversion part; and
a black matrix on a side, away from the base substrate, of a layer where the light-emitting devices are, wherein an orthographic projection of the black matrix on the base substrate overlaps the orthographic projection of the each gap between two adjacent light-emitting devices among the plurality of light-emitting devices on the base substrate, the black matrix comprises a plurality of openings, and an orthographic projection of each of the plurality of openings on the base substrate overlaps an orthographic projection of the photoelectric conversion part on the base substrate; and a collimating light-receiving angle θ in any direction determined by the openings and the photoelectric conversion part meets a following relation:

$$0° \leq \theta \leq \arctan\left(\frac{P}{2H}\right);$$

wherein
P is a valley-ridge size of a fingerprint, and H is a distance between a contact face of the fingerprint and the display substrate and an end face, away from one side of the base substrate, of the openings;

wherein in a same direction, a ratio of a size of each of the plurality of openings to a size of each of the at least one photoelectric conversion part is:

greater than or equal to 0.8 and less than or equal to 1; or
greater than 0 and less than 0.8.

* * * * *